(12) United States Patent
He et al.

(10) Patent No.: US 10,858,741 B2
(45) Date of Patent: Dec. 8, 2020

(54) PLASMA RESISTANT MULTI-LAYER ARCHITECTURE FOR HIGH ASPECT RATIO PARTS

(71) Applicant: Applied Materials, Inc., Santa Clara, CA (US)

(72) Inventors: Xiao-Ming He, Freemont, CA (US); Jennifer Y. Sun, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/298,964

(22) Filed: Mar. 11, 2019

(65) Prior Publication Data

US 2020/0291528 A1 Sep. 17, 2020

(51) Int. Cl.
*C23C 16/40* (2006.01)
*C23C 16/455* (2006.01)
(Continued)

(52) U.S. Cl.
CPC ............ *C23C 28/042* (2013.01); *C23C 16/40* (2013.01); *C23C 16/403* (2013.01);
(Continued)

(58) Field of Classification Search
CPC . C23C 28/042; C23C 16/40; C23C 16/45527; C23C 16/403;
(Continued)

(56) References Cited

U.S. PATENT DOCUMENTS 5,630,314 A 5/1997 Kojima et al.
5,805,973 A 9/1998 Coffinberry et al.
(Continued)

FOREIGN PATENT DOCUMENTS

CN 105225997 A 1/2016
JP H03115535 5/1991
(Continued)

OTHER PUBLICATIONS

Johansson, P. et al., "Atomic Layer Deposition Process for Barrier Applications of Flexible Packaging," 2010 Place Conference, Apr. 18-21, 2010, 33 pages, Albequerque, New Mexico.
(Continued)

*Primary Examiner* — David Sample
*Assistant Examiner* — Donald M Flores, Jr.
(74) *Attorney, Agent, or Firm* — Lowenstein Sandler LLP

(57) ABSTRACT

Disclosed herein is an article comprising one or more channels and a multi-layer protective coating on the one or more channels. The multi-layer protective coating includes an anodization layer comprising a plurality of cracks and a plurality of pores, a sealing layer on the anodization layer, and a top layer on the sealing layer. The sealing layer comprises a metal oxide, the seals the plurality of cracks and the plurality of pores, and has a porosity of approximately 0%. The top layer comprises a rare earth oxide, a rare earth fluoride, or a rare earth oxyfluoride, has a different material composition than the sealing layer, and has a porosity of approximately 0%.

18 Claims, 6 Drawing Sheets

(51) Int. Cl.
*C23C 28/04* (2006.01)
*C25D 11/24* (2006.01)

(52) U.S. Cl.
CPC ...... *C23C 16/45527* (2013.01); *C25D 11/246* (2013.01); *Y10T 428/1259* (2015.01); *Y10T 428/12493* (2015.01); *Y10T 428/12583* (2015.01); *Y10T 428/24975* (2015.01)

(58) Field of Classification Search
CPC ..... Y10T 428/24975; Y10T 428/12493; Y10T 428/12583; Y10T 428/1259; C25D 11/246
See application file for complete search history.

(56) References Cited

U.S. PATENT DOCUMENTS

| | | | |
|---|---|---|---|
| 5,840,434 A | 11/1998 | Kojima et al. | |
| 6,139,983 A | 10/2000 | Ohashi et al. | |
| 6,548,424 B2 | 4/2003 | Putkonen | |
| 6,632,549 B1 | 10/2003 | Ohashi et al. | |
| 6,641,941 B2 | 11/2003 | Yamada et al. | |
| 6,685,991 B2 | 2/2004 | Wataya et al. | |
| 6,777,353 B2 | 8/2004 | Putkonen | |
| 6,858,332 B2 | 2/2005 | Yamada | |
| 6,858,546 B2 | 2/2005 | Niinisto et al. | |
| 6,916,534 B2 | 7/2005 | Wataya et al. | |
| 7,138,192 B2 | 11/2006 | Yamada et al. | |
| 7,351,658 B2 | 4/2008 | Putkonen | |
| 7,384,696 B2 | 6/2008 | Hayasaki et al. | |
| 7,498,272 B2 | 3/2009 | Niinisto et al. | |
| 7,560,376 B2 | 7/2009 | Escher et al. | |
| 7,569,280 B2 | 8/2009 | Hayasaki et al. | |
| 7,696,117 B2 | 4/2010 | Sun et al. | |
| 7,754,621 B2 | 7/2010 | Putkonen | |
| 7,780,786 B2 | 8/2010 | Mitsuhashi et al. | |
| 7,968,205 B2 | 6/2011 | Nakano et al. | |
| 7,998,883 B2 | 8/2011 | Putkonen | |
| 8,304,019 B1 | 11/2012 | Pichler | |
| 8,399,862 B2 | 3/2013 | Ohmi et al. | |
| 8,619,406 B2 | 12/2013 | Cho et al. | |
| 8,858,745 B2 | 10/2014 | Sun et al. | |
| 8,916,021 B2 | 12/2014 | Sun et al. | |
| 9,012,030 B2 | 4/2015 | Han et al. | |
| 9,090,046 B2 | 7/2015 | Sun et al. | |
| 9,343,289 B2 | 5/2016 | Sun et al. | |
| 9,394,615 B2 | 7/2016 | Sun et al. | |
| 9,440,886 B2 | 9/2016 | Sun et al. | |
| 9,551,070 B2 | 1/2017 | Chang et al. | |
| 9,617,188 B2 | 4/2017 | Sun et al. | |
| 9,617,633 B2 | 4/2017 | He et al. | |
| 9,633,884 B2 | 4/2017 | He et al. | |
| 9,850,573 B1* | 12/2017 | Sun ................ | C23C 16/4404 |
| 2002/0177001 A1 | 11/2002 | Harada et al. | |
| 2003/0029563 A1 | 2/2003 | Kaushal et al. | |
| 2003/0051811 A1 | 3/2003 | Uchimaru et al. | |
| 2004/0023811 A1 | 2/2004 | Iijima | |
| 2005/0227118 A1 | 10/2005 | Uchimaru et al. | |
| 2006/0037536 A1 | 2/2006 | Kobayashi et al. | |
| 2006/0073354 A1 | 4/2006 | Watanabe et al. | |
| 2008/0066647 A1 | 3/2008 | Harada et al. | |
| 2008/0213496 A1 | 9/2008 | Sun et al. | |
| 2008/0264565 A1 | 10/2008 | Sun et al. | |
| 2009/0194233 A1 | 8/2009 | Tamura et al. | |
| 2010/0119843 A1 | 5/2010 | Sun et al. | |
| 2010/0119844 A1 | 5/2010 | Sun et al. | |
| 2010/0129670 A1 | 5/2010 | Sun et al. | |
| 2010/0323124 A1 | 12/2010 | Vartabedian et al. | |
| 2011/0091700 A1 | 4/2011 | Simpson | |
| 2012/0135155 A1 | 5/2012 | Han et al. | |
| 2012/0138472 A1 | 6/2012 | Han et al. | |
| 2013/0154059 A1 | 6/2013 | Ohmi et al. | |
| 2014/0116338 A1 | 5/2014 | He et al. | |
| 2014/0120312 A1 | 5/2014 | He et al. | |
| 2015/0004418 A1 | 1/2015 | Sun et al. | |
| 2015/0021324 A1 | 1/2015 | Sun et al. | |
| 2015/0024155 A1 | 1/2015 | Sun et al. | |
| 2015/0061237 A1 | 3/2015 | Sun et al. | |
| 2015/0064450 A1 | 3/2015 | Sun et al. | |
| 2015/0132602 A1 | 5/2015 | Sun et al. | |
| 2015/0152540 A1 | 6/2015 | Sato et al. | |
| 2015/0158775 A1 | 6/2015 | Sun et al. | |
| 2015/0299050 A1 | 10/2015 | Sun et al. | |
| 2015/0307982 A1 | 10/2015 | Firouzdor et al. | |
| 2015/0311043 A1 | 10/2015 | Sun et al. | |
| 2015/0311044 A1 | 10/2015 | Sun et al. | |
| 2015/0321964 A1 | 11/2015 | Sun et al. | |
| 2015/0329955 A1 | 11/2015 | Sun et al. | |
| 2016/0002811 A1* | 1/2016 | Sun ................ | C25D 3/54 428/629 |
| 2016/0079040 A1 | 3/2016 | Park et al. | |
| 2016/0181627 A1 | 6/2016 | Roeder et al. | |
| 2016/0211121 A1 | 7/2016 | Sun et al. | |
| 2016/0273095 A1 | 9/2016 | Lin et al. | |
| 2016/0312351 A1* | 10/2016 | Liu ................ | C23C 4/134 |
| 2016/0326625 A1 | 11/2016 | Sun et al. | |
| 2016/0326626 A1 | 11/2016 | Sun et al. | |
| 2016/0336210 A1 | 11/2016 | Cooke et al. | |
| 2016/0375515 A1 | 12/2016 | Xu et al. | |
| 2016/0379806 A1 | 12/2016 | Xu et al. | |
| 2017/0022595 A1 | 1/2017 | Sato et al. | |
| 2017/0110293 A1 | 4/2017 | Sun et al. | |
| 2017/0140969 A1 | 5/2017 | Kuo et al. | |
| 2017/0247795 A1 | 8/2017 | Sun et al. | |
| 2017/0314125 A1 | 11/2017 | Fenwick et al. | |
| 2017/0369993 A1 | 12/2017 | Sun | |
| 2018/0016678 A1 | 1/2018 | Fenwick et al. | |
| 2018/0030589 A1 | 2/2018 | Sun et al. | |
| 2018/0044800 A1 | 2/2018 | Hendrix et al. | |
| 2018/0066373 A1 | 3/2018 | Sun et al. | |
| 2018/0080116 A1 | 3/2018 | Sun et al. | |
| 2018/0094348 A1 | 4/2018 | Sun | |
| 2018/0105932 A1 | 4/2018 | Fenwick et al. | |
| 2018/0105938 A1 | 4/2018 | Sun et al. | |
| 2018/0112311 A1 | 4/2018 | Fenwick et al. | |
| 2018/0209042 A1 | 7/2018 | Wu et al. | |
| 2018/0240648 A1 | 8/2018 | Wu et al. | |
| 2018/0265972 A1 | 9/2018 | Firouzdor et al. | |
| 2018/0265973 A1 | 9/2018 | Firouzdor et al. | |
| 2018/0327892 A1 | 11/2018 | Wu et al. | |
| 2018/0327898 A1 | 11/2018 | Wu et al. | |
| 2018/0327899 A1 | 11/2018 | Wu et al. | |
| 2018/0330923 A1 | 11/2018 | Tran et al. | |
| 2018/0337026 A1 | 11/2018 | Firouzdor et al. | |
| 2019/0169444 A1 | 6/2019 | Gangakhedkar | |
| 2019/0194817 A1 | 6/2019 | Sun et al. | |

FOREIGN PATENT DOCUMENTS

| | | |
|---|---|---|
| JP | 2006082474 | 3/2006 |
| JP | 2007131951 | 5/2007 |
| JP | 2007217782 | 8/2007 |
| KR | 20170144396 | 4/2017 |
| WO | 2013032260 | 3/2013 |
| WO | 2015120265 | 8/2015 |

OTHER PUBLICATIONS

Putkonen, M. et al. "Low-Temperature ALE Deposition of $Y_2O_3$ Thin Films from β-Diketonate Precursors", Chemical Vapor Deposition, 2001, vol. 7, No. 1, pp. 44-50, Verlag GmbH, Weinheim, Germany.

Pilvi, T. et al. "ALD of $YF_3$ Thin Films from $TiF_4$ and Y(thd)3 Precursors", Chemical Vapor Deposition, 2009, vol. 15, pp. 27-32, Verlag GmbH & Co., Weinheim, Germany.

Rowland, J.C. "Atomic Layer Depositions of the $Al_2O_3$-$Y_2O_3$ Pseudo-Binary System", Doctoral Disertation, University of Florida, ProQuest LLC, 2010, pp. 1-106.

* cited by examiner

PLASMA RESISTANT MULTI-LAYER ARCHITECTURE FOR HIGH ASPECT RATIO PARTS

TECHNICAL FIELD

Embodiments disclosed herein relate, in general, to multi-layer protective coatings on the inner surfaces of articles with high-aspect ratio features, such as tubes, cylinders, pipes and other structures usable for gas delivery and/or remote plasma delivery.

BACKGROUND

Various manufacturing processes expose semiconductor process chamber components to high temperatures, high energy plasma, a mixture of corrosive gases, high stress, and combinations thereof. These extreme conditions may erode and/or corrode the chamber components, increasing the chamber components susceptibility to defects.

Protective coatings used for reducing defects on chamber components due to harsh processing conditions are typically deposited on chamber components. Protective coatings may be deposited by a variety of techniques, including thermal spray, sputtering, ion assisted deposition (IAD), plasma spray, and evaporation techniques. The options for coating the inner regions with high aspect ratios are constrained to non-line-of-sight techniques. Additionally, the coatings that have been deposited on the inner regions with high aspect ratios that carry plasma are prone to failure, and are associated with particle contamination, metal contamination, deviation in plasma composition, and other problems.

SUMMARY

Some of the embodiments described herein cover an article comprising with one or more channels and a multi-layer protective coating on the one or more channels. The multi-layer protective coating includes an anodization layer, a sealing layer over the anodization layer, and a top layer over the sealing layer. The anodization layer includes a plurality of cracks and a plurality of pores. The sealing layer comprises a metal oxide, has a porosity of approximately 0%, and seals the plurality of cracks and the plurality of pores in the anodization layer. The top layer comprises a metal oxide layer, or a ceramic layer, or a rare earth oxide layer, or another rare earth containing layer. The rare earth containing layer may be a rare earth fluoride, or a rare earth oxyfluoride. The top layer has a same or different material composition than the sealing layer. The top layer also has a porosity of approximately 0%.

In some embodiments, a plurality of articles are manufactured, each having one or more channels that are covered with the multi-layer protective coating. A part to part variation of a dielectric breakdown voltage between the plurality of articles, as measured at the one or more channels of the plurality of articles, is less than +/−10%.

In some embodiments, a method of forming a multi-layer coating on one or more channels of one or more articles includes anodizing a surface of the one or more channels of a first article to form an anodization layer on the one or more channels, the anodization layer comprising a plurality of cracks and a plurality of pores. The method further includes depositing a sealing layer onto the anodization layer using an atomic layer deposition (ALD) process, wherein the sealing layer comprises a metal oxide, and wherein the sealing layer seals the plurality of cracks and the plurality of pores, the sealing layer having a porosity of approximately 0%. The method further includes depositing a top layer onto the sealing layer using the ALD process, wherein the top layer comprises a metal oxide layer, or a ceramic layer, or a rare earth oxide layer. The ceramic layer may be a rare earth fluoride, or a rare earth oxyfluoride. The top layer has a same or different material composition with the sealing layer, and wherein the top layer has a porosity of approximately 0%.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
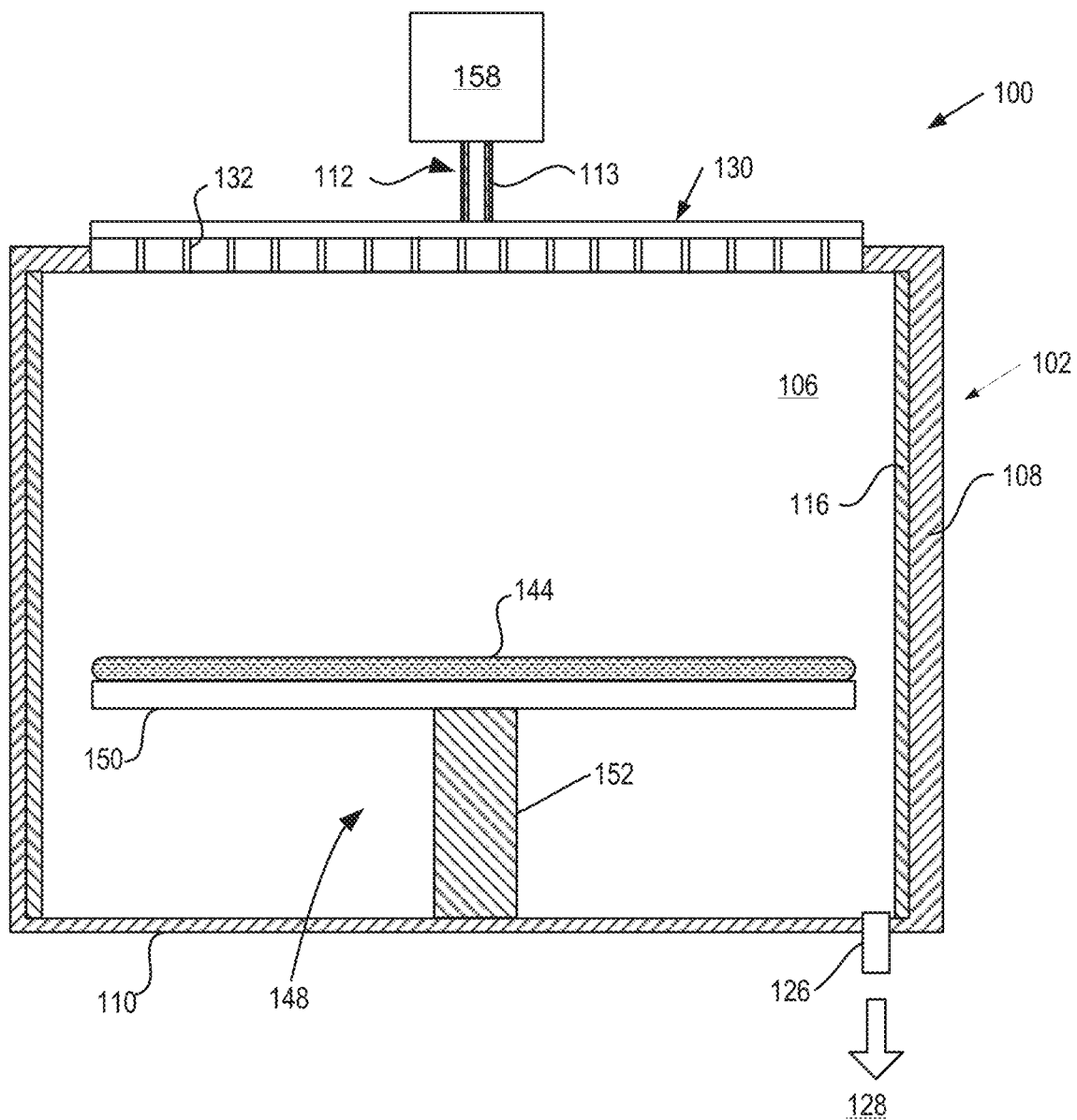
FIG. 1 depicts a sectional view of a processing chamber that includes one or more articles with channels that have been coated by a multi-layer protective coating in accordance with embodiments described herein.

Embodiments described herein cover coated articles (e.g., chamber components) and methods where a multi-layer protective coating (e.g., a multi-layer plasma resistant coating) having an anodization layer, a sealing layer and a top layer are deposited on an inner surface of the articles (e.g., on walls of one or more channels of the articles). The sealing layer may be a metal oxide layer deposited by atomic layer deposition (ALD). The top layer may be a ceramic layer such as a metal oxide layer, a rare earth oxide layer, a rare earth fluoride layer, or a rare earth oxyfluoride layer deposited by ALD. The top layer may be a plasma resistant layer.

The surface of the article (e.g., the surface of the one or more channels inside of the article) may be an aluminum, an aluminum alloy (e.g., Al 6061, Al 6063) or another metal or metal alloy. The combination of the anodization layer, the sealing layer and the top layer may result in a multi-layer protective coating that has a high dielectric breakdown voltage (e.g., a dielectric breakdown voltage of over 2000 Volts) and a high electrical impedance. The anodization layer may provide some plasma resistant protection for the one or more channels of the article. However, anodization layers generally have many cracks and pores that may be penetrated by plasma. By sealing the anodization layer with a sealing layer, the pores and cracks may be sealed, removing the pores and cracks as avenues for plasma to penetrate through the anodization layer to the underlying surface of the one or more channels. The top layer may then cover the sealing layer. The top layer may have a higher resistance to plasma attack, and may be more stable in a plasma environment than the sealing layer. For example, the sealing layer may be an oxide that has a similar coefficient of thermal expansion as the anodization layer, which may mitigate the formation of cracks during heating and cooling of the article. However, over time the sealing layer may be degraded by plasma (e.g., such as a fluorine-containing plasma). The top layer may be, for example, $Y_2O_3$, a yttrium-based oxide, a yttrium-based fluoride, a yttrium-based oxyfluoride, an erbium-based oxide, an erbium-based fluoride, or an erbium-based oxyfluoride. The top layer may undergo exposure to a fluorine-based plasma for hundreds of hours or more without any degradation of the top layer.

The multi-layer protective coating having the anodization layer, the sealing layer, and the top layer may provide a very uniform dielectric breakdown voltage (e.g., a consistent dielectric breakdown voltage of, at least, about 2000-2500 Volts that varies by less than +/−10% between parts). In some embodiments, the dielectric breakdown voltage varies by less than +/−5% between parts. In some embodiments, the dielectric breakdown voltage varies by less than +/−1% between parts. Additionally, electrical impedance may vary by less than 5% between parts. In contrast, plasma delivery lines for delivery of remote plasma that have just a standard anodization layer for protection may have varying dielectric breakdown voltages and/or electrical impedance values that vary by about +/−10% or more from article to article. Such large variation in dielectric breakdown voltage and electrical impedance may cause an undesirable variation in the plasma that passes through the articles.

The multi-layer protective coating having the anodization layer, the sealing layer, and the top layer may provide a very uniform electrical impedance. The electrical impedance of the multi-layer protective coating may remain stable even after it is exposed to high temperatures (e.g., temperatures in excess of 120° C.). The stable impedance of the multi-layer protective coating improves consistency of plasma that is delivered by components coated with the multi-layer protective coating. Additionally, the stable electrical impedance even at high temperatures enables articles coated by the multi-layer protective coating to be used for high temperature processes without degrading the performance of the articles.

Additionally, the multi-layer protective coating having the anodization layer, the sealing layer, and the top layer may provide a high plasma resistance. The surfaces of the inner channels of traditional plasma delivery lines have an anodization layer for protection. When fluorine-containing plasmas are flowed through the plasma delivery line, the fluorine reacts with the anodization layer and replaces oxygen molecules with fluorine molecules. This causes a volume expansion, which in turn causes particles to shed from the anodization layer. The shed particles then cause particle contamination of downstream parts and/or processed substrates. Additionally, the anodization layer changes the chemistry of the fluorine-containing plasma by absorbing some of the fluorine. Accordingly, the chemistry of the fluorine-containing plasma that flows through a plasma delivery line changes over time as the plasma delivery line ages. This change in the plasma chemistry causes variation in the processes that use the plasma, such as variation in etch rate for plasma etching. However, by using the multi-layer protective coating described in embodiments herein to coat the inner surfaces of channels within plasma delivery lines, the plasma variation can be virtually eliminated. The multi-layer protective coating absorbs little to no fluorine, and its composition does not change (or changes very little) over its useful life. Accordingly, the plasma chemistry of plasmas delivered by the plasma delivery lines remains constant or nearly constant over the life of the plasma delivery line (e.g., between when the plasma delivery line is new and when the plasma delivery line is old).

The sealing layer and the top layer may conformally cover the anodization layer with a substantially uniform thickness. In one embodiment, the sealing layer and the top layer have a conformal coverage of the underlying surface that is coated (including coated surface features) with a uniform thickness having a thickness variation of less than about +/−20%, a thickness variation of +/−10%, a thickness variation of +/−5%, or a lower thickness variation.

Embodiments described herein enable high aspect ratio features of chamber components and other articles to be effectively coated with multi-layer protective coatings having an anodization layer, a sealing layer, and a top layer. The sealing layer and the top layer are very dense with a porosity of about 0% (e.g., the plasma resistant coating may be porosity-free in embodiments).

The multi-layer protective coating may be resistant to corrosion and erosion from plasma etch chemistries, such as $CCl_4/CHF_3$ plasma etch chemistries, $HCl_3Si$ etch chemistries and $NF_3$ etch chemistries. Additionally, the multi-layer protective coating described herein may be resistant to cracking and delamination at temperatures up to about 350° C. For example, a chamber component having the plasma resistant coating described herein may be used in processes that include heating to temperatures of about 200° C. The chamber component may be thermally cycled between room temperature and the temperature of about 200° C. without introducing any cracks or delamination in the plasma resistant coating and/or changing an electrical impedance of the multi-layer protective coating.

Unlike other techniques typically used to deposit coatings on components having high aspect ratio features, such as plasma spray coating and ion assisted deposition, the anodization technique and ALD technique can deposit a layer of material within such features (i.e., on the surfaces of the features). Additionally, the ALD technique produces relatively thin (i.e., 1 μm or less) coatings that are porosity-free (i.e., pin-hole free), which may eliminate crack formation during deposition, and which may fill cracks and pores in the anodization layer. The term "porosity-free" as used herein means absence of any pores, pin-holes, voids, or cracks along the whole depth of the coating (e.g., as measured by transmission electron microscopy (TEM)).

Process chamber components, such as chamber walls, shower heads, nozzles, plasma generation units (e.g., radiofrequency electrodes with housings), diffusers, remote plasma delivery lines, gas lines, showerheads, gas delivery plates, and so on would benefit from having these plasma resistant coatings to protect the components in harsh plasma rich environments. Many of these chamber components have aspect ratios that range from about 5:1 to about 300:1, which makes them difficult to coat well using conventional deposition methods. Embodiments described herein enable high aspect ratio articles such as the aforementioned process chamber components to be coated with multi-layer protective coatings that protect the articles. For example, embodiments enable the insides of gas lines, the insides of nozzles, the insides of holes in showerheads, and so on to be coated with a multi-layer protective coating.

FIG. 1 is a sectional view of a processing chamber 100 (e.g., a semiconductor processing chamber) having one or more chamber components that are coated with a multi-layer protective coating in accordance with embodiments of the present disclosure. The multi-layer protective coating described in embodiments includes an anodization layer, a sealing layer deposited by ALD and a top layer also deposited by ALD. The processing chamber 100 may be used for processes in which a corrosive plasma environment is provided (e.g., in embodiments where a remote plasma is generated and then delivered to the processing chamber 100). For example, the processing chamber 100 may be a chamber for a plasma etch reactor (also known as a plasma etcher), a plasma cleaner, plasma enhanced chemical vapor deposition (CVD) or atomic layer deposition (ALD) reactors and so forth.

In one embodiment, the processing chamber 100 includes a chamber body 102 and a showerhead 130 that encloses an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material such as titanium (Ti). The chamber body 102 generally includes sidewalls 108 and a bottom 110.

An outer liner 116 may be disposed adjacent the sidewalls 108 to protect the chamber body 102. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

A showerhead 130 may be supported on the sidewall 108 of the chamber body 102. Alternatively, a lid may be supported on the sidewall 108 of the chamber body. The lid may include a hole that into which a nozzle has been inserted. The showerhead 130 (or lid) may be opened to allow access to the interior volume 106 of the processing chamber 100, and may provide a seal for the processing chamber 100 while closed.

A remote plasma system 158 may be coupled to the processing chamber 100 to generate a remote plasma and provide the remote plasma to the interior volume 106 of the chamber 100. A plasma delivery line 112 may connect the remote plasma system 158 to the chamber 100, and may include one or more channels through which the remote plasma flows. The plasma delivery line may be composed of aluminum, an aluminum alloy, or another metal or metal alloy. In an example, the plasma delivery line 112 may be a cylinder with a main channel that runs the length of the plasma delivery line 112. The plasma delivery line 112 may additionally include one or more side channels, which may intersect with the main channel, such as at 90 degree angles. The one or more side channels may have a smaller inner diameter than the main channel. For example, the main channel may have a diameter of about 0.5-1 inch, and the one or more side channels may have diameters of about 0.25-0.5 inches. The corners at which the main channel and one or more side channels intersect may be particularly susceptible to attack by corrosive plasma, and are common points of failure for plasma delivery lines. However, the channels of the plasma delivery lines 112, including these corners, may be coated by a multi-layer protective coating as described herein. After being coated with the multi-layer protective coating, the corners may no longer be points of failure for the plasma delivery line 112.

Showerhead 130 may be used for processing chambers used for dielectric etch (etching of dielectric materials). The showerhead 130 may include a gas distribution plate (GDP) and may have multiple gas delivery holes 132 (also referred to as channels) throughout the GDP. The showerhead 130 may be formed by metal or alloy plate with the protection by a multi-layer protective coating as described herein. The metal or alloy plate may be composed of aluminum, an aluminum alloy, or another metal or metal alloy. The showerhead 130 may be formed with the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth. The gas delivery holes 132 (channels) of the GDP may each be coated with the multi-layer protective coating in accordance with embodiments of the present disclosure.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. A remote plasma may be formed from any of these and/or other processing gases and then delivered through the plasma delivery line 112 to chamber 100. Accordingly, the remote plasma may be composed of $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A substrate support assembly 148 is disposed in the interior volume 106 of the processing chamber 100 below the showerhead 130. The substrate support assembly 148 holds a substrate 144 during processing. A ring (e.g., a single ring) may cover a portion of the electrostatic chuck 150, and may protect the covered portion from exposure to plasma during processing. The ring may be silicon or quartz in one embodiment.

An inner liner may be coated on the periphery of the substrate support assembly 148. The inner liner may be a halogen-containing gas resist material such as those discussed with reference to the outer liner 116. In one embodiment, the inner liner may be fabricated from the same materials of the outer liner 116.

In one embodiment, the substrate support assembly 148 includes a pedestal 152 that supports an electrostatic chuck 150. The electrostatic chuck 150 further includes a thermally conductive base and an electrostatic puck bonded to the thermally conductive base by a bond, which may be a silicone bond in one embodiment. The thermally conductive base and/or electrostatic puck of the electrostatic chuck 150 may include one or more optional embedded heating elements, embedded thermal isolators and/or conduits to control a lateral temperature profile of the substrate support assembly 148. The electrostatic puck may further include multiple gas passages such as grooves, mesas and other surface features that may be formed in an upper surface of the electrostatic puck. The gas passages may be fluidly coupled to a source of a heat transfer (or backside) gas such as He via holes drilled in the electrostatic puck. In operation, the backside gas may be provided at controlled pressure into the gas passages to enhance the heat transfer between the electrostatic puck and a supported substrate 144. The electrostatic chuck 150 may include at least one clamping electrode controlled by a chucking power source.

Any of the aforementioned chamber components of processing chamber 100 may include a multi-layer protective coating that was deposited in accordance with embodiments described herein. Embodiments are described with reference to coating the inner channels of articles using the multi-layer protective coating 113 because such inner channels are particularly difficult to protect and embodiments of the present disclosure work particularly well at protecting such inner channels (e.g., such as channels of plasma delivery lines 112). However, it should be understood that the multi-layer protective coating may be used to coat any metallic article that is capable of being anodized (e.g., any article composed of aluminum or an aluminum alloy). Examples of chamber components that may include a multi-layer protective coating include the substrate support assembly 148, a gas distribution plate, the showerhead 130, a flow equalizer, a cooling base, a faceplate, a selectivity modulation device (SMD), a plasma delivery line 112, and so on.

The multi-layer protective coating 113 may include an anodization layer, a sealing layer and a top layer. The anodization layer may have a thickness of about 100 nm to about 90 microns. In some examples, the anodization layer may have a thickness of about 13 microns (or about 0.5 mil), about 25 microns (or about 1 mil) or about 51 microns (or about 2 mils) or about 88 microns (or about 3.5 mils). The anodization layer may be composed of $Al_2O_3$ if the article being anodized is composed of aluminum or an aluminum alloy. In one embodiment, the anodization layer is a hard anodization layer.

The anodization layer may have multiple cracks and multiple pores. Some cracks may extend through the entire anodization layer and may expose portions of the underlying article that is covered by the anodization layer. For example, an anodization layer that is 50 microns thick may have a crack that is 50 microns long with a width of about 1 micron (e.g., with an aspect ratio of length to width of 50:1). In some embodiments, pores may also extend through the thickness of the anodization layer. In some embodiments, the anodization layer includes a thin dense barrier layer portion near a surface of the coated article and a thicker porous layer portion over the thin dense barrier layer portion. In such embodiments, the pores may extend the thickness of the porous layer portion of the anodization layer.

The sealing layer may be a metal oxide deposited onto the anodization layer by ALD. The sealing layer may seal the cracks and the columnar pores of the anodization layer. By sealing the columnar pores of the anodization layer, the sealing layer densifies the anodization layer and reduces a porosity of the anodization layer. In some instances, the porosity of the entire anodization layer is reduced by about 5% to about 50% to about 100% of the original porosity, depending on the anodization thickness. Anodization layers often have columnar pores with a diameter of about 10-50 nm. If the anodization layer has a thickness of less than 0.5 mil, it is possible for the ALD coating to fill all of the pores, effectively reducing a porosity of the anodization layer to close to 0%. In some instances, the porosity of the anodization layer is reduced to approximately 0% at or near the surface of the anodization layer. The sealing layer may coat the walls of any cracks in the anodization layer and/or the walls of pores in the anodization layer. As the sealing layer thickness reaches the diameter of cracks and/or pores, those cracks and/or pores may become filled by the sealing layer, and thus may be sealed. For example, an anodization layer that is 50 microns thick may have a crack that is 50 microns long with a width of about 1 micron (e.g., with an aspect ratio of vertical length to horizontal width of 50:1), and this crack may be entirely filled and sealed by the sealing layer (and/or by a subsequent top layer). In some instances, the sealing layer does not penetrate the entire depth of the pores in the anodization layer, and coats a portion of the pores extending from a surface of the anodization layer toward the bottom of the anodization layer. In other instances, the sealing layer does penetrate the entire depth of the pores in the anodization layer.

The sealing layer may have a thickness of about 10 nm to about 20 microns in embodiments. Some example thicknesses for the sealing layer include about 1-5 microns, about 8 microns, and about 10 microns. The sealing layer may be a composed of a single metal or a mixture of multiple metals. In some embodiments, the sealing layer has a coefficient of thermal expansion (CTE) that matches a CTE of the anodization layer. For example, if the anodization layer is $Al_2O_3$, then the sealing layer may also be $Al_2O_3$ (e.g., amorphous $Al_2O_3$). The sealing layer may act as a stress relief layer, and may mitigate any mismatch in CTE between the anodization layer and the top layer. The sealing layer may include amorphous aluminum oxide or similar material and may improve adhesion of the top layer to the anodization layer as well as thermal resistance to cracking and delamination of the top layer at temperatures up to about 350° C. in embodiments or 200° C. or from about 200° C. to about 350° C.

Other possible metal oxides that the sealing layer may be composed of include $Y_2O_3$, $YF_3$, and $Y_2O_3$ based ceramics, $Y_3Al_5O_{12}$ (YAG), $Y_4Al_2O_9$ (YAM), $ErAlO_3$, $GdAlO_3$, $NdAlO_3$, $YAlO_3$, $TiO_2$ (titania), $ZrO_2$ (zirconia), $Y_2O_3$ stabilized $ZrO_2$ (YSZ), $Er_2O_3$ and $Er_2O_3$ based ceramics, $Gd_2O_3$ and $Gd_2O_3$ based ceramics, $Er_3Al_5O_{12}$ (EAG), $Gd_3Al_5O_{12}$ (GAG), $Nd_2O_3$ and $Nd_2O_3$ based ceramics, a ceramic compound comprising $Y_4Al_2O_9$ and a solid-solution of $Y_2O_3$—$ZrO_2$, a ceramic compound comprising $Y_2O_3$, $Er_2O_3$, $ZrO_2$, $Gd_2O_3$ and $SiO_2$, or a combination of any of the above.

The top layer may be composed of a metal oxide or a ceramic compound that has the same composition and the same/different structure with the sealing layer. For one embodiment, when the sealing layer is the amorphous $Al_2O_3$ or $Y_2O_3$, the top layer may be the amorphous $Al_2O_3$ or amorphous $Y_2O_3$. In another embodiment, when the amorphous $Al_2O_3$ or $Y_2O_3$ reaches the very good sealing function on the anodized structure, the top layer may be crystalline $Al_2O_3$ or crystalline $Y_2O_3$ with or without a high-density crystal orientation (such as (111) crystalline orientation in FCC $Y_2O_3$ phase structure), which may further enhance the plasma resistance of the top layer coating in the plasma process.

The top layer may be composed of a rare earth oxide, a rare earth fluoride, or a rare earth oxyfluoride. The top layer may have a CTE that is different from the CTE of the anodization layer and the sealing layer. The top layer may include a single rare earth metal, or may include a mixture of a rare earth metal with other metals (e.g., including other rare earth metals). The top layer may be a plasma resistant layer that protects the multi-layer protective coating 113 and the underlying channel (or other article feature) from corrosion or erosion by plasma, such as fluorine-rich plasma. The top layer may have a thickness of about 10 nm to about 20 microns in embodiments. Some example thicknesses for the top layer include about 1-5 microns, about 8 microns, and about 10 microns. In some embodiments, a combined thickness of the sealing layer and the top layer is about 1-5 microns. Alternatively, the combined thickness may be about 1-20 microns.

The top layer may include rare earth oxides such as $Y_2O_3$, $YF_3$, and $Y_2O_3$ based ceramics, $Y_3Al_5O_{12}$ (YAG), $Y_4Al_2O_9$ (YAM), $ErAlO_3$, $GdAlO_3$, $NdAlO_3$, $YAlO_3$, $Y_2O_3$ stabilized $ZrO_2$ (YSZ), $Er_2O_3$ and $Er_2O_3$ based ceramics, $Gd_2O_3$ and $Gd_2O_3$ based ceramics, $Er_3Al_5O_{12}$ (EAG), $Gd_3Al_5O_{12}$ (GAG), $Nd_2O_3$ and $Nd_2O_3$ based ceramics, a ceramic compound comprising $Y_4Al_2O_9$ and a solid-solution of $Y_2O_3$—$ZrO_2$, a ceramic compound comprising $Y_2O_3$, $Er_2O_3$, $ZrO_2$, $Gd_2O_3$ and $SiO_2$, or a combination of any of the above. The top layer may also be composed of a solid solution formed by any of the aforementioned ceramics. The top layer may also be a multiphase material that includes a solid solution of one or more of the aforementioned materials and one or more additional phase.

The top layer may include a single metal or may be a complex metal oxide including a mixture of multiple metals. In embodiments, the complex metal oxide top layer may include a two metals composition ($M1_xM2_yO_z$), a three metals composition ($M1_wM2_xM3_yO_z$), a four metal composition ($M1_vM2_wM3_xM4_yO_z$), a five metal composition ($M1_uM2_vM3_wM4_xM5_yO_z$), a six metal composition ($M1_tM2_uM3_vM4_wM5_xM6_yO_z$), and so on. In each of the complex metal oxide coatings, the variables t, u, v, w, x, y, z may be positive integers or decimal values. Some example values of t, u, v, w, x, y, z may range from about 0.1 to about 10. In embodiments, the rare earth metal containing oxide layer is selected from $Y_xZr_yO_z$, $Er_xZr_yO_z$, $Y_wEr_xZr_yO_z$, $Y_wEr_xHf_yO_z$, $Y_wZr_xHf_yO_z$, $Er_wZr_xHf_yO_z$, $Y_vEr_wZr_xHf_yO_z$, $Y_xHf_yO_z$, $Er_xHf_yO_z$, $Y_xTa_yO_z$, $Er_xTa_yO_z$, $Y_wEr_xTa_yO_z$, $Y_wTa_xZr_yO_z$, $Y_wTa_xHf_yO_z$, $Er_wTa_xZr_yO_z$ $Er_wTa_xHf_yO_z$ and $Y_vEr_wTa_xHf_yO_z$. In one embodiment, the rare earth metal containing oxide layer includes YZOF having an atomic ratio of yttrium to zirconium of about 3:1. In further embodiments, the rare earth metal containing fluoride layer may include a composition selected from $La_wY_xZr_yO_z$, $Lu_wY_xZr_yO_z$, $Sc_wY_xZr_yO_z$, $Gd_wY_xZr_yO_z$, $Sm_wY_xZr_yO_z$, $Dy_wY_xZr_yO_z$, $La_wY_xTa_yO_z$, $Lu_wY_xTa_yO_z$, $Sc_wY_xTa_yO_z$, $Gd_wY_xTa_yO_z$, $Sm_wY_xTa_yO_z$, $Dy_wY_xTa_yO_z$, $Er_wY_xHf_yO_z$, $La_wY_xHf_yO_z$, $Lu_wY_xHf_yO_z$, $Sc_wY_xHf_yO_z$, $Gd_wY_xHf_yO_z$, $Sm_wY_xHf_yO_z$, $Dy_wY_xHf_yO_z$. In some embodiments, the coatings may contain $RE_wZr_xAl_yO_z$, for example, $Y_wZr_xAl_yO_z$. Other complex oxides may also be used.

With reference to the solid-solution of $Y_2O_3$—$ZrO_2$, the top layer may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 35-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 80-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

Advantageously, $Y_2O_3$ and $Er_2O_3$ are miscible. A single phase solid solution can be formed for any combination of $Y_2O_3$ and $Er_2O_3$. For example, a mixture of just over 0 mol % $Er_2O_3$ and just under 100 mol % $Y_2O_3$ may be combined and co-deposited to form a plasma resistant coating that is a single phase solid solution. Additionally, a mixture of just over 0 mol % $E_2O_3$ and just under 100 mol % $Y_2O_3$ may be combined to form a plasma resistant coating that is a single phase solid solution.

In one embodiment, the top layer includes or consists of a ceramic compound that includes a combination of $Y_2O_3$, $ZrO_2$, $Er_2O_3$, $Gd_2O_3$ and $SiO_2$. In one embodiment, the ceramic compound can include $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol % and $SiO_2$ in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

A yttrium-containing oxide layer for the top layer may be, for example, $Y_xZr_yO_z$, $Y_aZr_xAl_yO_z$, $Y_xAl_yO_z$, or $Y_xEr_yO_z$. The yttrium-containing oxide may be yttria ($Y_2O_3$) with yttriaite having a cubic structure with space group Ia-3 (206).

The top layer may include rare earth fluorides such $YF_3$, $ErF_3$, $GdF_3$, a mixture of $YF_3$ and $ZrF_4$, a mixture of $YF_3$, $ZrF_4$ and $AlF_3$, and so on. In certain embodiments, the top layer may be a fluoride formed of at least one rare earth metal (e.g., as the first metal) and at least one additional (e.g., second) metal (e.g., $RE_wM_yF_z$, $Y_xZr_yF_z$ or $RE_wY_xZr_yF_z$). The at least one rare earth metal may be selected from yttrium, erbium, lanthanum, lutetium, scandium, gadolinium, samarium or dysprosium. The at least one additional metal may be selected from a rare earth metal (RE), zirconium (Zr), aluminum (Al), hafnium (Hf) and silicon (Si) in embodiments. According to embodiments, the rare earth metal containing fluoride coating can contain about 5 mol % to about 30 mol %, or about 10 mol % to about 25 mol %, or about 15 mol % to about 20 mol % of at least one rare earth metal and about 1 mol % to about 40 mol %, or about 5 mol % to about 30 mol %, or about 10 mol % to about 20 mol % of at least one additional metal.

In embodiments, a complex metal fluoride top layer may include a two metal composition ($M1_xM2_yF_z$), a three metal composition ($M1_wM2_xM3_yF_z$), a four metal composition ($M1_vM2_wM3_xM4_yF_z$), a five metal composition ($M1_uM2_vM3_wM4_xM5_yF_z$), a six metal composition ($M1_tM2_uM3_vM4_wM5_xM6_yF_z$), and so on. In each of the complex metal fluoride coatings, the variables t, u, v, w, x, y, z may be positive integers or decimal values. Some example values of t, u, v, w, x, y, z may range from about 0.1 to about 10. In some embodiments the complex metal fluoride layer is a rare earth metal containing fluoride. In embodiments, the rare earth metal containing fluoride layer is selected from $Y_xZr_yF_z$, $Er_xZr_yF_z$, $Y_wEr_xZr_yF_z$, $Y_wEr_xHf_yF_z$, $Y_wZr_xHf_yF_z$, $Er_wZr_xHf_yF_z$, $Y_vEr_wZr_xHf_yF_z$, $Y_xHf_yF_z$, $Er_xHf_yF_z$, $Y_xTa_yF_z$, $Er_xTa_yF_z$, $Y_wEr_xTa_yF_z$, $Y_wTa_xZr_yF_z$, $Y_wTa_xHf_yF_z$, $Er_wTa_xZr_yF_z$ $Er_wTa_xHf_yF_z$ and $Y_vEr_wTa_xHf_yF_z$. In one embodiment, the rare earth metal containing fluoride layer includes YZrF having an atomic ratio of yttrium to zirconium of about 3. In further embodiments, the rare earth metal containing fluoride layer may include a composition selected from $La_wY_xZr_yF_z$, $Lu_wY_xZr_yF_z$, $Sc_wY_xZr_yF_z$, $Gd_wY_xZr_yF_z$, $Sm_wY_xZr_yF_z$, $Dy_wY_xZr_yF_z$, $La_wY_xZr_yF_z$, $Lu_wY_xTa_yF_z$, $Sc_wY_xTa_yF_z$, $Gd_wY_xTa_yF_z$, $Sm_wY_xTa_yF_z$, $Dy_wY_xTa_yF_z$, $Er_wY_xHf_yF_z$, $La_wY_xHf_yF_z$, $Lu_wY_xHf_yF_z$, $Sc_wY_xHf_yF_z$, $Gd_wY_xHf_yF_z$, $Sm_wY_xHf_yF_z$, $Dy_wY_xHf_yF_z$. In some embodiments, the coatings may contain $RE_wZr_xAl_yF_z$, for example, $Y_wZr_xAl_yF_z$. Other complex fluorides may also be used.

Examples of yttrium-containing fluoride compounds of which the top layer may be formed include YF, $Y_xAl_yF_z$, $Y_xZr_yF_z$, $Y_xHf_yF_z$, $Y_aZr_xAl_yF_z$, $Y_aZr_xHf_yF_z$, $Y_aHf_xAl_yF_z$, $Y_vZr_wHf_xAl_yF_z$, or $Y_xEr_yF_z$. The yttrium content in the coating may range from about 0.1 mol % to close to 100 mol %. For yttrium-containing fluorides, the yttrium content may range from about 0.1 mol % to close to 100 mol % and the fluorine content may range from about 0.1 mol % to close to 100 mol %.

Examples of erbium-containing fluoride compounds that the top layer may be formed of include $ErF_3$, $Er_xAl_yF_z$ (e.g., $Er_3Al_5F_{12}$), $Er_xZr_yF_z$, $Er_xHf_yF_z$, $Er_aZr_xAl_yF_z$, $Er_aZr_xHf_yF_z$, $Er_aHf_xAl_yF_z$, $Y_xEr_yF_z$, and $Er_aY_xZr_yF_z$. The erbium content in the plasma resistant coating may range from about 0.1 mol % to close to 100 mol %. For erbium-containing fluorides, the erbium content may range from about 0.1 mol % to close to 100 mol % and the fluorine content may range from about 0.1 mol % to close to 100 mol %.

Plasma resistant coatings of $Y_xEr_yF_z$ may contain between over 0 mol % to under 100 mol % $YF_3$ and over 0 mol % to under 100 mol % $ErF_3$. Some notable examples include 90-99 mol % $YF_3$ and 1-10 mol % $ErF_3$, 80-89 mol % $YF_3$ and 11-20 mol % $Er_2O_3$, 70-79 mol % $YF_3$ and 21-30 mol % $ErF_3$, 60-69 mol % $YF_3$ and 31-40 mol % $ErF_3$, 50-59 mol % $YF_3$ and 41-50 mol % $ErF_3$, 40-49 mol % $YF_3$ and 51-60 mol % $ErF_3$, 30-39 mol % $YF_3$ and 61-70 mol % $ErF_3$, 20-29 mol % $YF_3$ and 71-80 mol % $ErF_3$, 10-19 mol % $Y_2O_3$ and 81-90 mol % $ErF_3$, and 1-10 mol % $YF_3$ and 90-99 mol % $ErF_3$. The single phase solid solution of $Y_xEr_yF_z$ may have a monoclinic cubic state at temperatures below about 2330° C.

Advantageously, $ZrF_4$ may be combined with $YF_3$ and $ErF_3$ to form a single phase solid solution containing a mixture of $ZrF_4$, $YF_3$ and $ErF_3$ (e.g., $Er_aY_xZr_yF_z$). The solid solution of $Y_aEr_xZr_yF_z$ may have a cubic, hexagonal, tetragonal and/or cubic fluorite structure. The solid solution of $Y_aEr_xZr_yF_z$ may contain over 0 mol % to 60 mol % Zr, over 0 mol % to 99 mol % $ErF_3$, and over 0 mol % to 99 mol % $YF_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $ErF_3$ and/or $YF_3$ that may be used include 10 mol %, 20 mol %, 30 mol %, 40 mol %, 50 mol %, 60 mol %, 70 mol %, 80 mol %, and 90 mol %.

Plasma resistant coatings of $Y_aZr_xAl_yF_z$ may contain over 0% to 60 mol % Zr, over 0 mol % to 99 mol % $YF_3$, and over 0 mol % to 60 mol % Al. Some notable amounts of $ZrO_2$ that may be used include 2 mol %, 5 mol %, 10 mol %, 15 mol %, 20 mol %, 30 mol %, 50 mol % and 60 mol %. Some notable amounts of $YF_3$ that may be used include 10 mol %, 20 mol %, 30 mol %, 40 mol %, 50 mol %, 60 mol %, 70 mol %, 80 mol %, and 90 mol %. Some notable amounts of $Al_2O_3$ that may be used include 2 mol %, 5 mol %, 10 mol %, 20 mol %, 30 mol %, 40 mol %, 50 mol % and 60 mol %. In one example, the plasma resistant coating of $Y_aZr_xAl_yF_z$ contains 42 mol % $YF_3$, 40 mol % Zr and 18 mol % Al and has a lamellar structure. In another example, the plasma resistant coating of $Y_aZr_xAl_yF_z$ contains 63 mol % $YF_3$, 10 mol % Zr and 27 mol % $ErF_3$ and has a lamellar structure.

In embodiments, the rare earth metal containing fluoride top layer contains about 1 mol % to about 40 mol % of a first metal (e.g., a rare earth metal such as Y, Er, etc.) and about 1 mol % to about 40 mol % of a second metal (e.g., a rare earth metal, Zr, Hf, Ta, Al, Si). In embodiments, the top layer contains about 1 mol % to about 40 mol %, or about 5 mol % to about 30 mol % yttrium and about 1 mol % to about 40 mol %, or about 1 mol % to about 20 mol % zirconium, hafnium or tantalum, or about 10 mol % to about 25 mol % yttrium and about 5 mol % to about 17 mol % Zr, Hf or Ta, or about 15 mol % to about 21.5 mol % yttrium and about 10 mol % to about 14.5 mol % Zr, Hf or Ta. In embodiments, the top layer contains a mixture of Y and Er, where the combined mol % of the Y and Er is about 5 mol % to about 30 mol % (e.g., may contain 1-29 mol % Y and 1-29 mol % Er). The top layer may additionally contain about 1 mol % to about 20 mol % zirconium, hafnium or tantalum.

The top layer may include rare earth oxyfluorides such as a Y—O—F layer that has a single Y—O—F phase or multiple different Y—O—F phases. Some possible Y—O—F phases that the Y—O—F coating may have are YOF ht, YOF rt, YOF tet, $Y_2OF_4$ (e.g., $Y_2OF_4$ ht-hp), $Y_3O_2F_5$ (e.g., $Y_3O_2F_5$ ht-hp), $YO_{0.4}F_{22}$ (e.g., $YO_{0.4}F_{22}$ht-hp), $Y_5O_4F_7$, $Y_6O_5F_8$, $Y_7O_6F_9$, and $Y_{17}O_{14}F_{23}$. The top layer may alternatively include other rare earth fluorides such as a Y—Zr—O—F layer.

In some embodiments, the rare earth oxyfluoride top layer disclosed herein may be expressed as M-O—F. M may be one or more rare earth metals including, but not limited to, Y, Gd, Yb, Er and/or one or more of another metal such as Hf, Ta, Al or Zr. In some embodiments, the rare earth oxyfluoride top layer disclosed herein may be Y—O—F, Y—Zr—O—F, Ta—Zr-O—F, Y—Hf—O—F, Ta—O—F, Hf—O—F, Er—O—F, Y—Er—O—F, Y—Zr—Hf—O—F, Y—Al—Zr—Hf—O—F, Y—Er—Zr—O—F, Y—Er—Zr—Hf—O—F, and so on. For instance, in some embodiments, the metal in M-O—F refers to at least two metals, such as M1-M2-O—F, M1-M2-M3-O—F, M1-M2-M3-M4-0-F, etc.

A M1-O—F layer may comprise M1 concentration between about 0 mol % and 100 mol %, between about 5 mol % and 100 mol %, between about 10 mol % and 95 mol %, between about 20 mol % and 90 mol %, between about 20 mol % and 80 mol %, about 10 mol %, about 20 mol %, about 30 mol %, about 40 mol %, about 50 mol %, about 60 mol %, about 70 mol %, about 80 mol %, about 90 mol %, or any other range and/or number falling within these ranges, where the concentration is measured based on total amount of metal in the metal oxyfluoride coating. When the concentration is measured based on the metal oxyfluoride coating as a whole, the M1 concentration may be up to about 40 mol %, up to about 35 mol %, up to about 30 mol %, up to about 25 mol %, up to about 20 mol %, up to about 15 mol %, up to about 10 mol %, up to about 5 mol %, or any other range and/or number falling within these ranges.

A M1-M2-O—F layer may comprise one of the following compositions: about 20-80 mol % M1 and 20-80 mol % M2, 30-70 mol % M1 and 30-70 mol % M2, 40-60 mol % M1 and 40-60 mol % M2, 50-80 mol % M1 and 20-50 mol % M2, or 60-70 mol % M1 and 30-40 mol % M2, where the concentrations of M1 and M2 are measured based on total amount of metal (M1+M2) in the metal oxyfluoride coating. When the concentration is measured based on the metal oxyfluoride coating as a whole, M1+M2 may together have a concentration of up to about 40 mol %, up to about 35 mol %, up to about 30 mol %, up to about 25 mol %, up to about 20 mol %, up to about 15 mol %, up to about 10 mol %, up to about 5 mol %, or any other range and/or number falling within these ranges.

A M1-M2-M3-O—F layer may comprise one of the following compositions: about 5-80 mol % M1 and 5-80 mol % M2 and 5-80 mol % M3, 10-70 mol % M1 and 10-70 mol % M2 and 10-70 mol % M3, 1-90 mol % M1 and 1-90 mol % M2 and 1-90 mol % M3, where the concentrations of M1, M2, and M3 are measured based on total amount of metal (M1+M2+M3) in the metal oxyfluoride coating. When the concentration is measured based on the metal oxyfluoride coating as a whole, M1+M2+M3 may together have a concentration of up to about 40 mol %, up to about 35 mol %, up to about 30 mol %, up to about 25 mol %, up to about 20 mol %, up to about 15 mol %, up to about 10 mol %, up to about 5 mol %, or any other range and/or number falling within these ranges.

A M1-M2-M3-M4-O—F layer may comprise one of the following compositions: about 20-40 mol % M1 and 20-40 mol % M2 and 20-40 mol % M3 and 20-40 mol % M4, 5-70 mol % M1 and 5-70 mol % M2 and 5-70 mol % M3 and 5-70 mol % M4, 1-80 mol % M1 and 1-80 mol % M2 and 1-80 mol % M3 and 1-80 mol % M4, where the concentrations of M1, M2, M3, and M4 are measured based on total amount of metal (M1+M2+M3+M4) in the metal oxyfluoride coating. When the concentration is measured based on the metal oxyfluoride coating as a whole, M1+M2+M3+M4 may together have a concentration of up to about 40 mol %, up to about 35 mol %, up to about 30 mol %, up to about 25 mol %, up to about 20 mol %, up to about 15 mol %, up to about 10 mol %, up to about 5 mol %, or any other range and/or number falling within these ranges.

The concentration of any particular metal (M1, M2, M3, or M4) in a metal oxyfluoride layer may be with respect to the total amount of metal (M) in the metal oxyfluoride composition (M-O—F). For example, in a M1-M2-O—F composition, M1 may be present at about 20-80 mol % and M2 may be present at about 20-80 mol % as measured with respect to the mol % of M1 and M2 together. However, M1 may be present at about 1-40 mol % and M2 may be present at about 1-40 mol % as measured with respect to the composition M1-M2-O—F.

Figure 2:
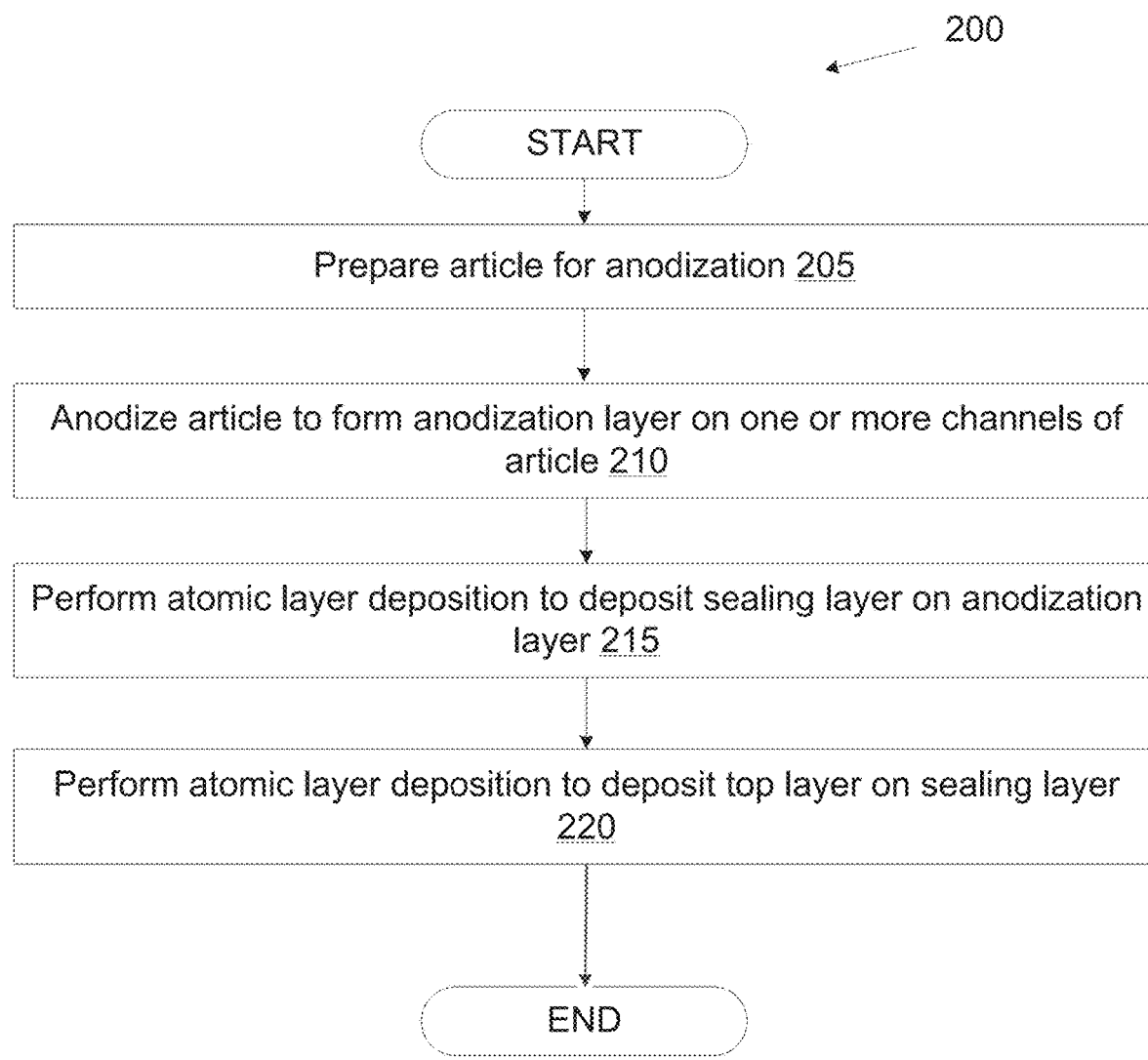
FIG. 2 depicts one embodiment of a process for coating channels of articles with multi-layer protective coatings.

FIG. 2 depicts one embodiment of a method 200 for coating channels of articles with multi-layer protective coatings. At block 205 of method 200, an article (e.g., a cylinder used as a plasma delivery line) may be prepared for anodization. The surface of the article may be altered by roughening, smoothing, and/or cleaning of the surface, for example.

At block 210, the article is anodized to form an anodization layer on the surface (e.g., walls) of one or more channels of the article. Anodization of the article may include immersing the article in an anodization bath, including an acid solution, along with a cathode body. Examples of cathode bodies that may be used include aluminum alloys such as Al6061 and Al3003 and carbon bodies. The anodization layer is grown on the article (e.g., on the walls of one or more channels in the article) by passing a current through an electrolytic or acid solution via a current supplier (e.g., a battery or other power supply). The current then releases hydrogen at the cathode body, e.g., the negative electrode, and oxygen at the surface of the article to form an anodization layer of aluminum oxide. In embodiments, the voltage that enables anodization using various solutions may range from about 1 to about 300 V or from about 15 to about 21 V. The anodizing current varies with the area of the cathode body anodized, and can range from about 30 to about 300 amperes/meter$^2$ (2.8 to 28 ampere/ft$^2$).

The acid solution dissolves (e.g., consumes or converts) a surface of the article (e.g., the aluminum coating) to form a coating of pores (e.g., columnar nano-pores). The anodization layer then continues growing from this coating of nano-pores. The pores may have a diameter in a range from about 10 nm to about 50 nm (e.g., about 30 nm) in embodiments. The acid solution can be oxalic acid, phosphoric acid, sulfuric acid (Type III anodization), or a combination of these acids, and/or other acids. For oxalic acid, the ratio of consumption of the article to anodization layer growth is about 1:1. Electrolyte concentration, acidity, solution temperature, and current are controlled to form a consistent aluminum oxide anodization layer on the article. In one embodiment, the anodization layer can be grown to have a thickness in a range from about 100 nm to about 90 microns.

In one embodiment, the current density is initially high to grow a very dense barrier layer portion of the anodization layer, and then current density is reduced to grow a porous columnar layer portion of the anodization layer. The barrier layer may have a porosity of less than about 1% in embodiments. In one embodiment where oxalic acid is used to form the anodization layer, the porosity (e.g., of the porous columnar layer portion of the anodization layer or of the entire anodization layer) is in a range from about 40% to about 50% or higher, and the pores have a diameter in a range from about 10 nm to about 50 nm.

The article is anodized (e.g., via oxalic anodization) to form the anodization layer on a surface of one or more channels of the article, where pores may be formed between anodization columns formed of $Al_2O_3$. The anodization layer can be formed to have a certain thickness that results in an aspect ratio of the anodization column height to the pore diameter being in a range from about 10 to 1 (10:1) to about 2000 to 1 (2000:1) in some embodiments. Such aspect ratios may ensure pores that are suitably deep in some embodiments. For example, pore diameter is typically in a range from about 10 nm to about 50 nm (e.g., about 30 nm), so an aspect ratio of 10 to 1 would result in the anodization layer having a thickness of about 300 nm. In another example, an aspect ratio of 2000 to 1 would result in the anodization layer having a thickness of about 60 microns.

A standard final step in the anodization process is to perform deionized water (DI) sealing. DI sealing is a process in which an anodized part is immersed into deionized water (e.g., hot DI water at about 96-100° C.) to form hydrated aluminum oxide (boehmit) in columnar pores of the anodization layer. DI sealing is performed to close or seal the columnar structure (e.g., the pores) of the anodization layer.

Without a high quality sealing, the anodization layer (anodic coating) may be highly absorbent of dirt, grease, oils and stains. Typically the DI sealing is performed to give a maximum corrosion resistance. However, in embodiments the DI sealing process is omitted to enable the subsequent sealing layer to anchor to and seal the columnar pores and provide good adhesion.

In embodiments, rather than performing a DI sealing, ALD is performed to deposit a metal oxide sealing layer at block 210. Prior to the deposition of the sealing layer and after the anodization process, a heat treatment may be performed on the article to remove residual moisture from pores of the anodization layer. Such heat treatment may be performed for a time in a range from about 2 to about 12 hours at a temperature in a range from about 60 degrees C. to about 150 degrees C.). For example, the article with the anodization layer can be baked for about 6 hours at about 95 degrees C. in an embodiment.

At block 215, ALD is performed to deposit a sealing layer on the anodization layer. The sealing layer may be composed of any of the aforementioned materials discussed with reference to the sealing layer. The sealing layer may penetrate and seal cracks and/or pores in the anodization layer. In embodiments, the sealing layer densifies the anodization layer, reducing its porosity.

ALD allows for a controlled self-limiting deposition of material through chemical reactions with the surface of the article. Aside from being a conformal process, ALD is also a uniform process. All exposed sides of the anodization layer, including high aspect ratio features (e.g., about 10:1 to about 300:1) will have the same or approximately the same amount of material deposited. A typical reaction cycle of an ALD process starts with a precursor (i.e., a single chemical such as an yttrium precursor) flooded into an ALD chamber and adsorbed onto the surface of the anodization layer, forming an adsorption layer. The excess precursor is then flushed out of the ALD chamber before a reactant (i.e., a single chemical such as an oxygen source or a fluorine source) is introduced into the ALD chamber and subsequently flushed out, reacting with the adsorption layer to form a thin layer of the target coating.

The sealing layer may, in some embodiments, be formed by co-deposition of materials. To achieve this, a mixture of two precursors, such as a yttrium-containing oxide precursor (A) (e.g., $Y_2O_3$) and another metal oxide (B) precursor, are co-injected ($A_xB_y$) at any number of ratios, for example, A90+B10, A70+B30, A50+B50, A30+B70, A10+A90 and so on, into the chamber and adsorbed on the surface of the article. In these examples, x and y are expressed in molar ratios (mol %) for Ax+By. For example A90+B10 is 90 mol % of A and 10 mol % of B. Excess precursors are flushed out. A reactant is introduced into the ALD chamber and reacts with the adsorbed precursors to form a solid layer before the excess chemicals are flushed out.

The sealing layer may also be formed by a deposition sequence in which a first precursor for first metal is injected into the ALD chamber containing the article and flushed out, followed by injection of a second precursor for a second metal being injected into the ALD chamber and then flushed out. The first precursor may adsorb onto the surface of the anodization layer, and subsequently the second precursor may adsorb onto the surface of the anodization layer, optionally displacing some of the first precursor that was adsorbed onto the surface. Generally, where the concentration of the first precursor adsorbed onto the surface will be higher than the concentration of the second precursor adsorbed onto the surface. Subsequently, an oxygen-containing reactant may be injected into the ALD chamber to react with the first and second precursors adsorbed onto the surface.

Each ALD deposition cycle may result in a thin layer (e.g., on the order of one or a few angstroms thick). The ALD deposition cycle may be repeated until a target thickness is reached. For ALD, the final thickness of material is dependent on the number of reaction cycles that are run, because each reaction cycle will grow a layer of a certain thickness that may be one atomic layer or a fraction of an atomic layer.

At block 220, ALD is performed to deposit a top layer on the sealing layer. The top layer may be composed of any of the aforementioned materials discussed with reference to the top layer. The top layer may be formed using any of the ALD deposition techniques described with reference to the ALD deposition of the sealing layer. In some embodiments, the top layer is composed of a rare earth fluoride or a rare earth oxyfluoride. For ALD deposition of a rare earth fluoride, after adsorption of one or more metal precursors onto a surface of the anodization layer, a fluorine-containing reactant is injected into the ALD chamber rather than an oxide-containing reactant. The fluorine-containing reactant may react with the adsorbed precursors to form a rare earth fluoride (e.g., $YF_3$). For ALD deposition of a rare earth oxyfluoride, after adsorption of one or more metal precursors onto a surface of the anodization layer, a fluorine-containing reactant and an oxygen-containing reactant may be injected into the ALD chamber to react with the adsorbed metals. In some embodiments, the fluorine-containing reactant and the oxygen-containing reactant are co-injected into the ALD chamber. A ratio of the oxygen-containing reactant and the fluorine-containing reactant may be based on a target ratio of oxygen to fluorine in the top layer. Alternatively, a fluorine-containing reactant may be injected into the ALD chamber, then flushed out, followed by injection of an oxygen-containing reactant into the ALD chamber. Alternatively, an oxygen-containing reactant may be injected into the ALD chamber, then flushed out, followed by injection of a fluorine-containing reactant into the ALD chamber.

In some embodiments, the sealing layer and/or top layer may have an adhesion strength of approximately 4-25 MPa (e.g., greater than approximately 14 MPa in one embodiment). Adhesion strength may be determined by applying a normal force (e.g., measured in megapascals) to the ceramic coating until the ceramic coating peels off from the article.

Figure 3:
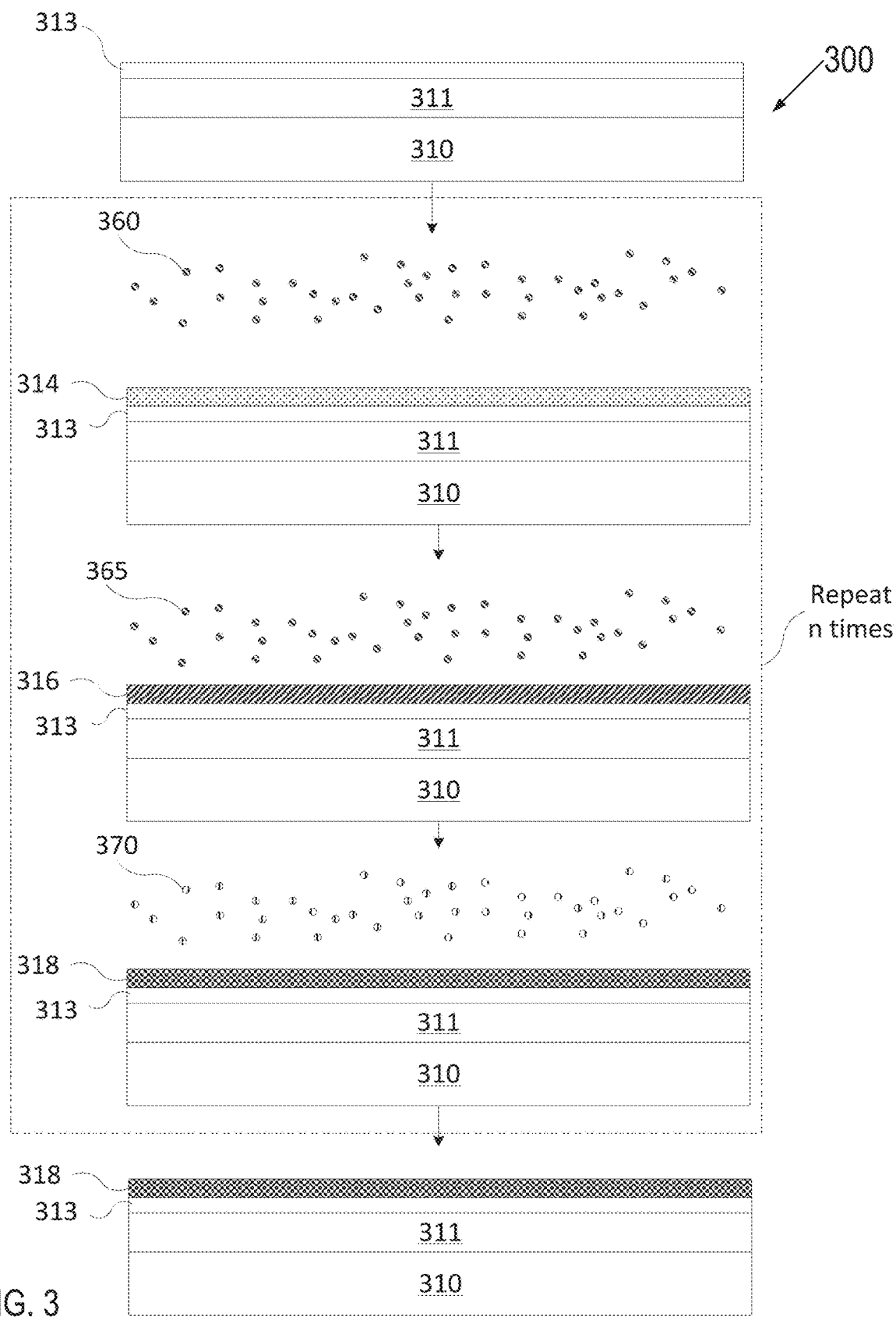
FIG. 3 depicts one embodiment of a deposition process in accordance with an atomic layer deposition technique as described herein.

FIG. 3 depicts one embodiment of an ALD deposition process to grow or deposit a top layer that comprises a mixture of multiple metals onto an article 310. As shown, the article 310 may include an anodization layer and a sealing layer 313 on the anodization layer. The top layer 318 may then be deposited over the sealing layer.

Article 310 may represent various process chamber components (e.g., semiconductor process chamber components) including but not limited to a substrate support assembly, an electrostatic chuck (ESC), a ring (e.g., a process kit ring or single ring), a chamber wall, a base, a gas distribution plate, gas lines, a showerhead, plasma electrodes, a plasma housing, a nozzle, a lid, a liner, a liner kit, a shield, a plasma screen, a flow equalizer, a cooling base, a chamber viewport, a chamber lid, a diffuser, a plasma delivery line, and so on. The article 310 may be made from a metal (such as aluminum, stainless steel).

For ALD, either adsorption of a precursor onto a surface or a reaction of a reactant with the adsorbed precursor may be referred to as a "half-reaction." During a first half reaction, a precursor is pulsed onto the surface of the sealing layer 313 for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed with a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

Sealing layer 313 may be introduced to a first precursor 360 for a first duration until a surface of sealing layer 313 is at least partially adsorbed with the first precursor 360 to form an adsorption layer 314. Subsequently, sealing layer 313 may be introduced to a second precursor 365 for a second duration until the surface of the sealing layer 313 is additionally adsorbed with the second precursor 365 to form a mixed-metal adsorption layer 316. Subsequently, a reactant 370 is injected into the ALD chamber containing the article 310 to react with the mixed-metal adsorption layer 316 to deposit a solid top layer 318. The first precursor 360 may be a precursor for a rare earth metal or other metal, and the second precursor may be for another rare earth metal or other metal. If more than two metals are to be included in the sealing layer, then after formation of the mixed-metal adsorption layer, a precursor for one or more additional metals may also be adsorbed onto the surface of the sealing layer 313. If the top layer is a rare earth oxide layer, then the reactant 370 may be oxygen, water vapor, ozone, pure oxygen, oxygen radicals, or another oxygen source. If the top layer is a rare earth fluoride layer, then the reactant 370 may be a fluorine-containing reactant, such as $TiF_4$ or HF.

Sealing layer 313 and top layer 318 may be uniform, continuous and conformal. The sealing layer 313 and the top layer 318 may be porosity free (e.g., have a porosity of 0) or have an approximately 0 porosity in embodiments (e.g., a porosity of 0% to 0.01%).

One full ALD cycle (e.g., that includes introduction of precursors 360 and 365 followed by introduction of reactants 370) may result in less than or about a single atomic layer. Multiple full ALD deposition cycles may be implemented to deposit a thicker top layer 318, with each full cycle (e.g., including introducing precursor 360, flushing, introducing precursor 365, flushing, introducing reactant 370, and again flushing) adding to the thickness by an additional fraction of an atom to a few atoms. As shown, up to n full cycles may be performed to grow the top layer 318, where n is an integer value greater than 1.

Method 300 describes an ALD deposition technique referred to herein as co-deposition. "Co-deposition" refers to atomic layer deposition where the metal precursors or the O-containing reactant or the F-containing reactants are co-injected sequentially (i.e. one metal precursor is injected followed by injection of another metal precursor and only after a mixture of different metal precursors is deposited, a reactant is introduced to react with the precursors). The concentration of various components in co-deposition may be related to the injection rate of each component.

Alternatively, the top layer may be deposited using an ALD deposition technique referred to herein as co-dosing. "Co-dosing" refers atomic layer deposition where the metal precursors or the O-containing reactant or the F-containing reactants are co-injected simultaneously (i.e., one metal precursor is dosed simultaneously with a second metal precursor, and only after the mixture of different metal precursors is deposited, a reactant is introduced to react with the precursors). The concentration of various components in co-dosing may be related to the injection rate of each component.

Alternatively, the top layer may be deposited using an ALD deposition technique referred to herein as sequential deposition. Sequential deposition refers to atomic layer deposition where a first metal precursor is adsorbed onto a surface, followed by reaction with an oxygen-containing reactant or fluorine-containing reactant, followed by adsorption of a second metal precursor onto the surface, followed by reaction with the oxygen-containing reactant or the fluorine-containing reactant.

The ALD layers (e.g., sealing layer and top layer) disclosed herein are thin, dense, porosity free and highly conformal. As used herein the term conformal as applied to a layer means that the layer covers features of an article with substantially uniform thickness. In one embodiment, conformal layers discussed herein have a conformal coverage of the underlying surface that is coated (including coated surface features) with a uniform thickness having a thickness variation of less than about +/−20%, a thickness variation of less than about +/−10%, a thickness variation of less than about +/−5%, or a lower thickness variation.

Figure 4:
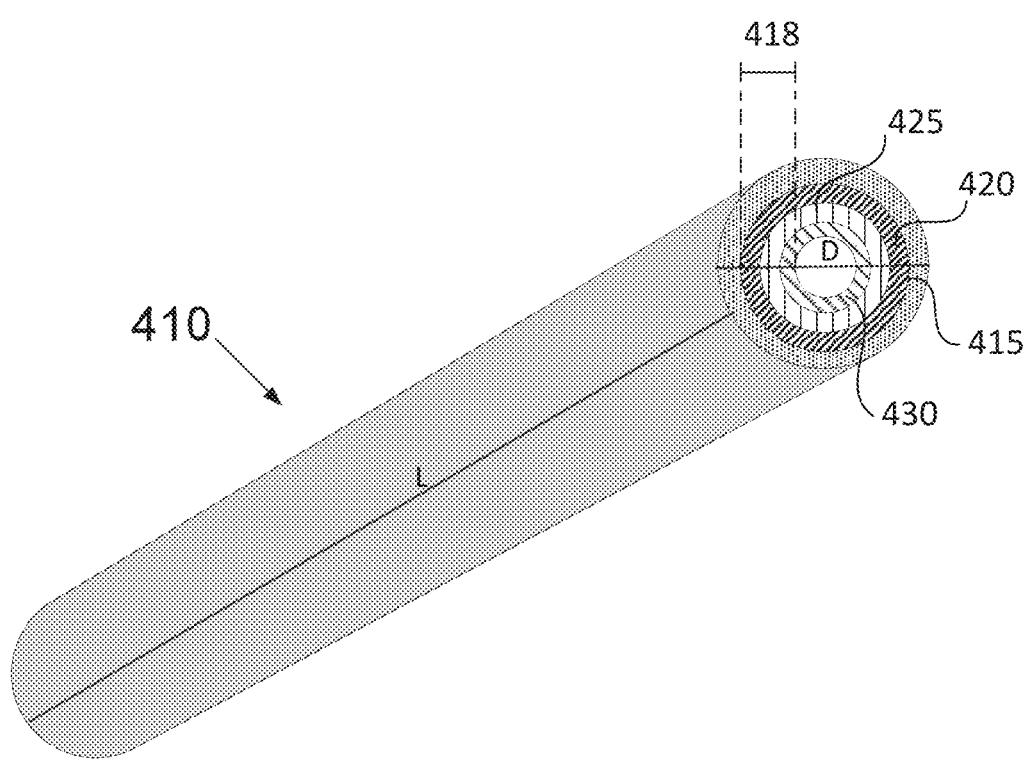
FIG. 4 depicts an article (e.g., a cylinder configured to deliver remote plasma), wherein an inner channel of the article is coated with a multi-layer protective coating, in accordance with embodiments of the present disclosure.

FIG. 4 depicts an article (e.g., a cylinder configured to deliver remote plasma), wherein an inner channel of the article is coated with a multi-layer protective coating, in accordance with embodiments of the present disclosure. The article 410 has a high aspect ratio coated according to an embodiment. Article 410 may have a length L and a diameter D. Article 410 may have a high aspect ratio defined as L:D, wherein the aspect ratio may range from about 5:1 to about 300:1. In some embodiments, the aspect ratio may be about 50:1 to about 100:1.

Article 410 may have an interior surface 415 which may be coated with a multi-layer protective coating 418. The multi-layer protective coating 418 may comprise an anodization layer 420 on the surface of an inner channel of the article 410, a sealing layer 425 on the anodization layer 420, and a top layer 430 on the sealing layer 425. The sealing layer and top layer may be coated using an ALD process. The ALD process may grow conformal coating layers of uniform thickness that are porosity-free throughout the interior surface of channels of the article 410 despite its high aspect ratio while ensuring that the final multi-layer protective coating 418 may also be thin enough so as to not plug the channels (e.g., such as for gas conduits in a showerhead or GDP).

Figure 5:
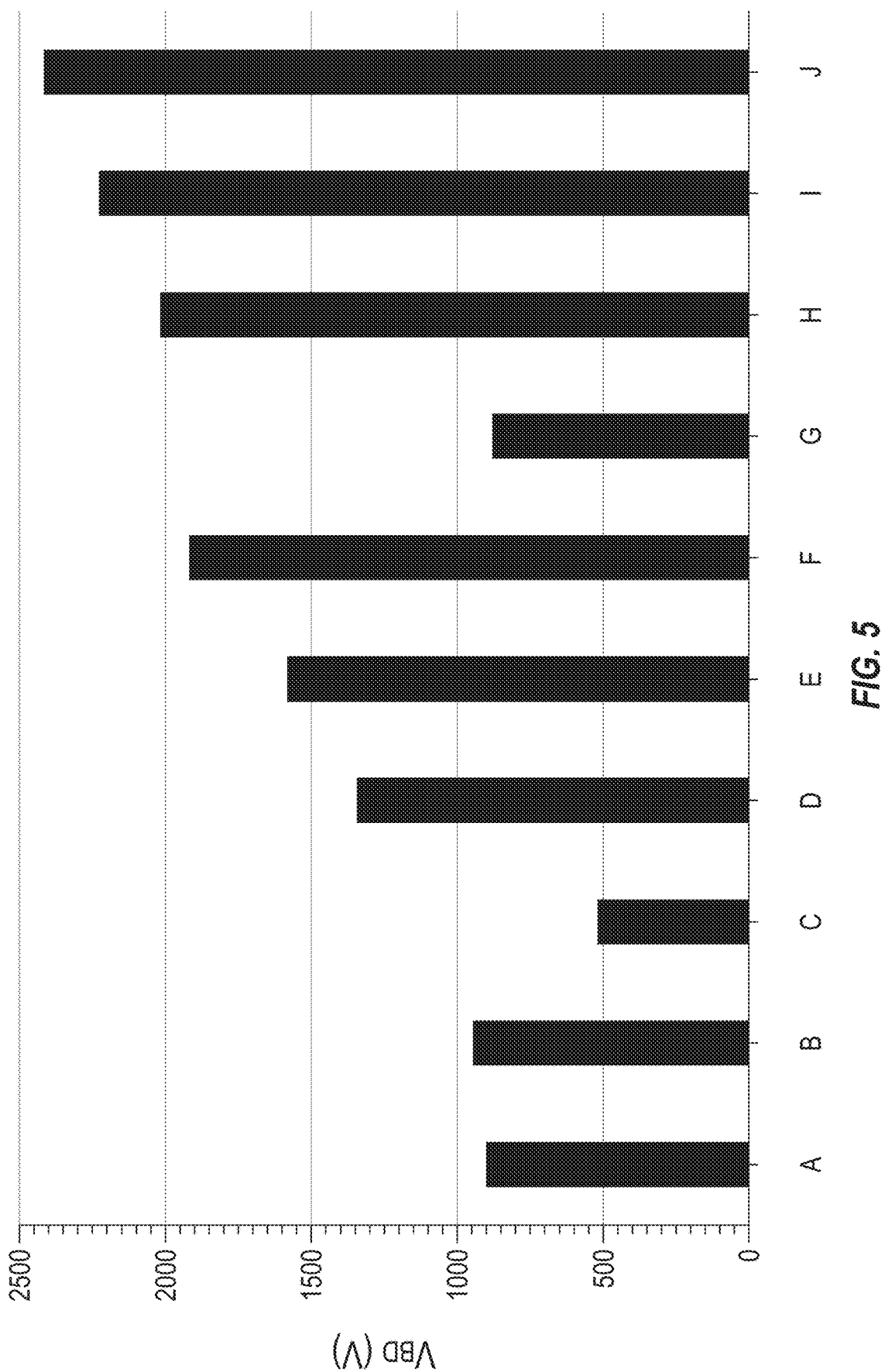
FIG. 5 is a chart comparing dielectric breakdown voltages of articles that have been coated with various protective coatings.

FIG. 5 is a chart comparing dielectric breakdown voltages of articles that have been coated with various protective coatings. As shown, an aluminum article with a 2 mil thick anodization layer that has been sealed using a traditional DI sealing (sample A) has a dielectric breakdown voltage of about 950 Volts. An aluminum article with a 2 mil thick anodization layer that has not been sealed using a traditional DI sealing (sample B) has a dielectric breakdown voltage of about 980 Volts. An aluminum article with a 2 micron thick $Al_2O_3$ ALD coating (sample C) has a dielectric breakdown voltage of about 500 Volts. An aluminum article with a 0.5 mil thick anodization layer and a 2 micron thick $Al_2O_3$ sealing layer (sample D) has a dielectric breakdown voltage of about 1400 Volts. An aluminum article with a 1.0 mil thick anodization layer and a 2 micron thick $Al_2O_3$ sealing layer (sample E) has a dielectric breakdown voltage of about 1550 Volts. An aluminum article with a 2.0 mil thick anodization layer and a 2 micron thick $Al_2O_3$ sealing layer (sample F) has a dielectric breakdown voltage of about 1950 Volts. An aluminum article with a 2 micron thick $Al_2O_3$ ALD layer and a 1 micron thick $Y_2O_3$ ALD layer (sample G) has a dielectric breakdown voltage of about 900 Volts. An aluminum article with a 0.5 mil thick anodization layer, a 2 micron thick $Al_2O_3$ ALD layer and a 1 micron thick $Y_2O_3$ ALD layer (sample H) has a dielectric breakdown voltage of slightly over 2000 Volts. An aluminum article with a 1.0 mil thick anodization layer, a 2 micron thick $Al_2O_3$ ALD layer and a 1 micron thick $Y_2O_3$ ALD layer (sample I) has a dielectric breakdown voltage of about 2350 Volts. An aluminum article with a 2.0 mil thick anodization layer, a 2 micron thick $Al_2O_3$ ALD layer and a 1 micron thick $Y_2O_3$ ALD layer (sample J) has a dielectric breakdown voltage of about 2500 Volts.

Bubble testing was also performed to determine an amount of time that it takes for a solution with 5% HCl (and optionally a remainder of $H_2O$) to penetrate a coating on an article and react with an underlying surface of the article (causing bubbles). The higher the bubble test time, the more protection the coating provides to the underlying article. Sample A showed a bubble test time of about 300 minutes. Sample B showed a bubble test time of about 0 minutes. Samples C, D, E and F showed a bubble test time of about 1950 minutes. Samples G, H, I and J all showed bubble test times that exceeded the test parameters (e.g., that were longer than 33 hours). Samples G, H, I and J may completely prevent the HCl acid solution from reaching the underlying article in some embodiments.

The anodization process is considerably quicker than the ALD deposition process. Accordingly, it is preferable in some embodiments to keep the thickness of the ALD layers to a minimum thickness that still provides target plasma resistance, part longevity and dielectric breakdown voltage. As shown, the combination of an anodization layer, an $Al_2O_3$ sealing layer and a $Y_2O_3$ top layer provides the best (highest) dielectric breakdown voltage and best (highest) electrical impedance while minimizing thicknesses of the sealing layer and top layer. Similar superior performance may be observed for combinations of an anodization layer, an $Al_2O_3$ sealing layer and other rare earth oxide, rare earth fluoride, and rare earth oxyfluoride top layers. The multi-layer protective coating that includes the anodization layer, sealing layer and top layer as described herein also has high plasma resistance (e.g., due to the composition of the top layer) and high thermal resistance (e.g., due to the CTE match between the sealing layer and the anodization layer).

Additionally, part-to-part uniformity of dielectric breakdown voltage and electrical impedance for anodized parts is generally very low (e.g., with a part to part variation of +/−10% or greater). This leads to a high variance in the dielectric breakdown voltage and electrical impedance between different parts (e.g., between different samples of the same type of plasma delivery line manufactured using the same process). Such large variation in dielectric breakdown voltage and electrical impedance may result in differences in the plasma transported by the different plasma delivery lines, which reduces repeatability of manufacturing steps that utilize the remote plasma delivered by the plasma delivery lines. Experimentation has shown that remote plasma delivery lines (and other parts) manufactured in accordance with embodiments of the present disclosure that include the multi-layer protective coating on the channel walls of remote plasma deliver lines have a high part to part uniformity with regards to dielectric breakdown voltage (a low deviation of dielectric breakdown voltage between parts) and electrical impedance. This provides an advantage that process engineers can rely on consistent plasma that is delivered by the plasma delivery lines coated with the multi-layer protective coating.

Figure 6:
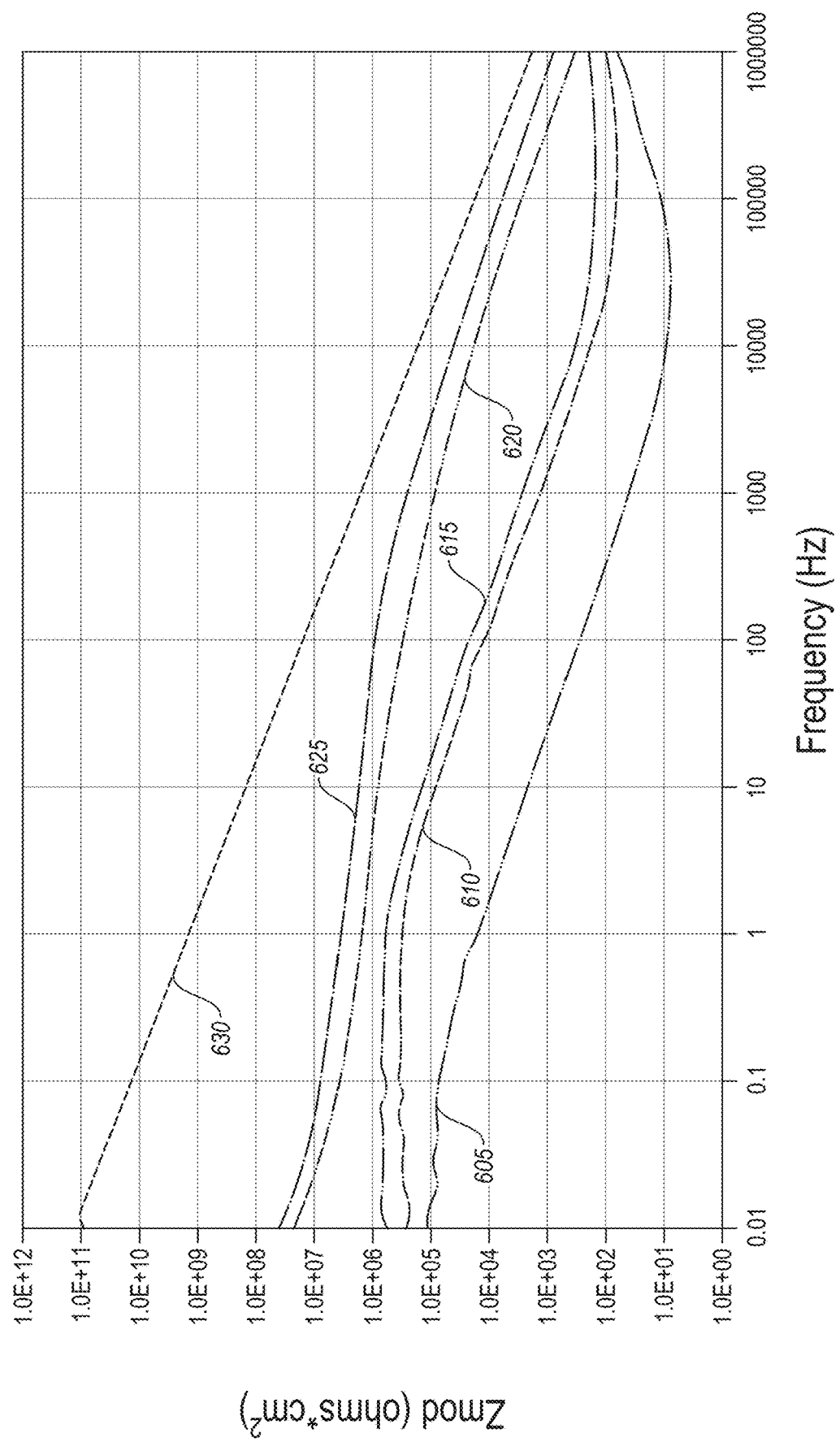
FIG. 6 is a chart comparing potentiostatic electrochemical impedance spectroscopy (EIS) results for articles that have been coated with various protective coatings.

FIG. 6 is a chart comparing potentiostatic electrochemical impedance spectroscopy (EIS) results for articles that have been coated with various protective coatings. The chart shows electrical impedance for an area (Zmod) on the y-axis with units of ohms*$cm^2$ and frequency on the x-axis with units of Hz. As shown, bare aluminum 605 has the lowest impedance values. Aluminum with an anodization layer 620, 625 has varying impedance values that are general acceptable. However, after an anodization layer is exposed to high temperatures of greater than 120° C., the impedance of the anodization layer drops. Aluminum with an anodization layer that has been exposed to temperatures of between 120° C. and 150° C. 615 ? is shown to have only slightly better impedance than the aluminum with the failed anodization layer 610. The anodization layer fails after exposure to temperatures of over 150° C. Aluminum with a failed anodization layer 610 has far lower electrical impedance values than aluminum with an anodization layer that has not been exposed to elevated temperatures.

The highest impedance values are exhibited by an aluminum part with the multi-layer protective coating 630 that is described in embodiments. The high impedance values of the aluminum part with the multi-layer protective coating 630 are maintained even after the part having the multi-layer protective coating is exposed to temperatures that are over 120° C. or even over 150° C. The impedance values for the aluminum part with the multi-layer protective coating 630 are the same before and after the exposure to the high temperatures. Accordingly, parts that are coated with the multi-layer protective coating can be used in high temperature processes without the impedance values of the part degrading over time. This improves process to process uniformity, which ultimately may improve yields of manufactured parts (e.g., of semiconductors). In embodiments, the electrical impedance of the aluminum part with the multi-layer protective coating 630 remains stable even with exposure to process temperatures of up to 350° C. Accordingly, an electrical impedance of the multi-layer protective coating may have approximately a same electrical impedance before exposure to a temperature of between about 120° C. and about 350° C. and after exposure to the temperature of between about 120° C. and about 350° C.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or"

rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An article comprising:
   one or more channels; and
   a multi-layer protective coating on the one or more channels, the multi-layer protective coating comprising:
      an anodization layer, the anodization layer comprising a plurality of cracks and a plurality of pores;
      a sealing layer on the anodization layer, wherein the sealing layer comprises a metal oxide, and wherein the sealing layer seals the plurality of cracks and the plurality of pores, the sealing layer having a porosity of approximately 0%; and
      a top layer on the sealing layer, wherein the top layer comprises a metal oxide, a rare earth oxide, a rare earth fluoride, or a rare earth oxyfluoride, wherein the top layer has a same or a different material composition as compared to the sealing layer, and wherein the top layer has a porosity of approximately 0%;
   wherein the multi-layer protective coating has a dielectric breakdown voltage of at least 2000 Volts.

2. The article of claim 1, wherein the one or more channels comprise a length to diameter aspect ratio of greater than about 5:1.

3. The article of claim 1, wherein the sealing layer consists essentially of $Al_2O_3$.

4. The article of claim 1, wherein:
   a thickness of the anodization layer is about 100 nm to about 90 microns; and
   a combined thickness of the sealing layer and the top layer is about 1-5 microns.

5. The article of claim 1, wherein the top layer comprises the metal oxide or the rare earth oxide, and wherein the rare earth oxide is selected from a group consisting of $Y_2O_3$, $Al_2O_3$, $Y_3Al_5O_{12}$ (YAG), $Y_4Al_2O_9$ (YAM), $YAlO_3$ (YAP), $Er_2O_3$, $Er_3Al_5O_{12}$ (EAG), $ZrO_2$, $Gd_2O_3$, a solid solution of $Y_2O_3$—$ZrO_2$, and a ceramic compound comprising $Y_4Al_2O_9$ and a solid-solution of $Y_2O_3$—$ZrO_2$.

6. The article of claim 1, wherein the top layer comprises the rare earth fluoride, and wherein the rare earth fluoride is selected from a group consisting of $YF_3$, $ErF_3$, $ZrF_4$ and $GdF_3$.

7. The article of claim 1, wherein the top layer comprises the rare earth oxyfluoride, and wherein the rare earth oxyfluoride is selected from a group consisting of yttrium oxyfluoride, erbium oxyfluoride, zirconium oxyfluoride, aluminum oxyfluoride, and gadolinium oxyfluoride.

8. The article of claim 1, wherein the sealing layer is selected from a group consisting of $Y_2O_3$, $Y_3Al_5O_{12}$ (YAG), $Y_4Al_2O_9$ (YAM), $YAlO_3$ (YAP), $Er_2O_3$, $Er_3Al_5O_{12}$ (EAG), $ZrO_2$, $Gd_2O_3$, a solid solution of $Y_2O_3$—$ZrO_2$, $Al_2O_3$, and a ceramic compound comprising $Y_4Al_2O_9$ and a solid-solution of $Y_2O_3$—$ZrO_2$.

9. The article of claim 1, wherein the article comprises aluminum or an aluminum alloy, and wherein the article comprises a remote plasma delivery cylinder.

10. The article of claim 1, wherein an electrical impedance of the multi-layer protective coating has approximately a same electrical impedance before exposure to a temperature of between about 120° C. and about 350° C. and after exposure to the temperature of between about 120° C. and about 350° C.

11. A plurality of articles, wherein:
    each article of the plurality of articles comprises:
       one or more channels; and
       a multi-layer protective coating on the one or more channels, the multi-layer protective coating comprising:
          an anodization layer, the anodization layer comprising a plurality of cracks and a plurality of pores;
          a sealing layer on the anodization layer, wherein the sealing layer comprises $Al_2O_3$, and wherein the sealing layer seals the plurality of cracks and the plurality of pores, the sealing layer having a porosity of approximately 0%; and
          a top layer on the sealing layer, wherein the top layer comprises a metal oxide, a rare earth oxide, a rare earth fluoride, or a rare earth oxyfluoride, wherein the top layer has a same or a different material composition as compared to the sealing layer, and wherein the top layer has a porosity of approximately 0%;
    wherein a part to part variation of a dielectric breakdown voltage between the plurality of articles, as measured at the one or more channels of the plurality of articles, is less than about +/−5%.

12. The plurality of articles of claim 11, wherein the dielectric breakdown voltage of the one or more channels for each of the plurality of articles is over 2000 Volts.

13. A method of forming a multi-layer protective coating on one or more channels of one or more articles, comprising:
    anodizing a surface of the one or more channels of a first article to form an anodization layer on the one or more channels, the anodization layer comprising a plurality of cracks and a plurality of pores;
    depositing a sealing layer onto the anodization layer using an atomic layer deposition (ALD) process, wherein the sealing layer comprises a metal oxide, and wherein the sealing layer seals the plurality of cracks and the plurality of pores, the sealing layer having a porosity of approximately 0%; and
    depositing a top layer onto the sealing layer using the ALD process, wherein the top layer comprises a metal oxide, a rare earth oxide, a rare earth fluoride, or a rare earth oxyfluoride, wherein the top layer has a same or a different material composition as compared to the sealing layer, and wherein the top layer has a porosity of approximately 0%;
    wherein the multi-layer protective coating has a dielectric breakdown voltage of at least 2000 Volts.

14. The method of claim 13, wherein the sealing layer consists essentially of $Al_2O_3$.

15. The method of claim 13, wherein the anodization layer has a thickness of about 0.5 microns to about 90 microns and a combined thickness of the sealing layer and the top layer is about 1-5 microns.

16. The method of claim 13, further comprising:
anodizing surfaces of the one or more channels of a plurality of additional articles to form an anodization layer on the one or more channels of the plurality of additional articles;
depositing a sealing layer onto the anodization layer of the plurality of additional articles using the ALD process; and
depositing a top layer onto the sealing layer of the plurality of additional articles using the ALD process;
wherein a part to part variation of the dielectric breakdown voltage between the first article and the plurality of additional articles is less than about +/−5%.

17. The method of claim 13, wherein the top layer comprises the rare earth oxide, wherein the rare earth oxide comprises a mixture of at least a first metal and a second metal, and wherein depositing the top layer comprises:
performing a deposition cycle comprising:
injecting a first precursor for the first metal into a deposition chamber containing the first article to cause the first precursor to adsorb onto a surface of the one or more channels;
subsequently injecting a second precursor for the second metal into the deposition chamber containing the first article to cause the second precursor to adsorb onto the surface of the one or more channels; and
subsequently injecting an oxygen-containing reactant into the deposition chamber; and
repeating the deposition cycle one or more times until a target thickness is reached for the top layer.

18. The method of claim 13, wherein the top layer comprises the rare earth oxyfluoride, and wherein depositing the top layer comprises:
performing a deposition cycle comprising:
injecting a first precursor for a rare earth metal into a deposition chamber containing the first article to cause the first precursor to adsorb onto a surface of the one or more channels;
subsequently injecting a first one of an oxygen-containing reactant and a fluorine-containing reactant into the deposition chamber containing the first article; and
subsequently injecting a second one of the oxygen-containing reactant and the fluorine-containing reactant into the deposition chamber containing the first article; and
repeating the deposition cycle one or more times until a target thickness is reached for the top layer.

* * * * *